(12) United States Patent
Carothers et al.

(10) Patent No.: US 9,466,520 B2
(45) Date of Patent: Oct. 11, 2016

(54) LOCALIZED REGION OF ISOLATED SILICON OVER RECESSED DIELECTRIC LAYER

(71) Applicant: Texas Instruments Incorporated, Dallas, TX (US)

(72) Inventors: Daniel Nelson Carothers, Lucas, TX (US); Jeffrey R. Debord, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/301,765

(22) Filed: Jun. 11, 2014

(65) Prior Publication Data

US 2015/0294901 A1 Oct. 15, 2015

Related U.S. Application Data

(60) Provisional application No. 61/978,933, filed on Apr. 13, 2014.

(51) Int. Cl.

| H01L 21/762 | (2006.01) |
|---|---|
| H01L 21/306 | (2006.01) |
| H01L 21/02 | (2006.01) |
| H01L 21/3105 | (2006.01) |
| H01L 21/84 | (2006.01) |

(52) U.S. Cl.
CPC ..... *H01L 21/76267* (2013.01); *H01L 21/0262* (2013.01); *H01L 21/02164* (2013.01); *H01L 21/02238* (2013.01); *H01L 21/02532* (2013.01); *H01L 21/02667* (2013.01); *H01L 21/30625* (2013.01); *H01L 21/31055* (2013.01); *H01L 21/76262* (2013.01); *H01L 21/76281* (2013.01); *H01L 21/84* (2013.01); H01L 21/02255 (2013.01)

(58) Field of Classification Search
CPC .............. H01L 21/02532; H01L 21/02636; H01L 21/02639; H01L 21/02647; H01L 21/76879; H01L 21/02645; H01L 21/02664; H01L 21/02667; H01L 29/66287; H01L 21/762; H01L 21/76276
USPC ................ 438/424, 479, 481, 486, 489; 257/E21.131
See application file for complete search history.

(56) References Cited

U.S. PATENT DOCUMENTS

| 4,497,683 | A | * | 2/1985 | Celler et al. ..................... 117/44 |
|---|---|---|---|---|
| 4,576,851 | A | * | 3/1986 | Iwamatsu ..................... 428/156 |
| 4,923,826 | A | * | 5/1990 | Jastrzebski et al. .......... 438/154 |
| 5,618,741 | A | * | 4/1997 | Young et al. .................. 438/151 |
| 6,214,697 | B1 | * | 4/2001 | Moore et al. ................. 438/424 |
| 6,919,238 | B2 | * | 7/2005 | Bohr ............................. 438/166 |
| 7,842,564 | B2 | * | 11/2010 | Mizushima et al. .......... 438/166 |
| 2009/0191673 | A1 | * | 7/2009 | Noguchi et al. .............. 438/166 |

* cited by examiner

*Primary Examiner* — Michael Trinh
(74) *Attorney, Agent, or Firm* — John R. Pessetto; Frank D. Cimino

(57) ABSTRACT

An integrated circuit is formed by forming an isolation recess in a single crystal substrate which includes silicon, filling the isolation recess with isolation dielectric material, and planarizing the isolation dielectric material to be coplanar with the top surface of the substrate to form a buried isolation layer. A non-selective epitaxial process forms single-crystalline silicon-based semiconductor material on exposed areas of the substrate and polycrystalline or amorphous silicon-based material on the buried isolation layer. A cap layer is formed over the epitaxial silicon-based material, and a radiantly-induced recrystallization process causes the polycrystalline or amorphous silicon-based material to form single-crystalline semiconductor over the buried isolation layer.

20 Claims, 15 Drawing Sheets

LOCALIZED REGION OF ISOLATED SILICON OVER RECESSED DIELECTRIC LAYER

CROSS-REFERENCE TO RELATED APPLICATIONS

This application claims the benefit of priority under U.S.C. §119(e) of U.S. Provisional Application 61/978,933, filed Apr. 13, 2014, which is hereby incorporated by reference in its entirety.

FIELD OF THE INVENTION

This invention relates to the field of integrated circuits. More particularly, this invention relates to dielectric isolation layers in integrated circuits.

BACKGROUND OF THE INVENTION

An integrated circuit with some circuits or components in dielectrically isolated silicon may be formed on a silicon-on-insulator (SOI) wafer. SOI wafers are more expensive than bulk and epitaxial wafers, undesirably increasing the cost of the integrated circuit. Alternately, the circuits or components may be formed over buried layers of silicon dioxide; methods to form the buried silicon dioxide layers such as implanting oxygen have been problematic with respect to providing desired lateral and vertical dimension control of the buried oxide layer, and undesirably increase stress on the wafer, leading to problems during photolithographic operations. Forming thin layers of device quality silicon over buried oxide layers has also been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by forming an isolation recess in a single crystal substrate which includes silicon, filling the isolation recess with isolation dielectric material, and planarizing the isolation dielectric material to be coplanar with the top surface of the substrate to form a buried isolation layer. A non-selective epitaxial process forms single-crystalline silicon-based semiconductor material on exposed areas of the substrate and polycrystalline or amorphous silicon-based material on the buried isolation layer. A cap layer is formed over the epitaxial silicon-based material, and a radiantly-induced recrystallization process causes the polycrystalline or amorphous silicon-based material to form single-crystalline semiconductor over the buried isolation layer.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following co-pending patent applications are related and hereby incorporated by reference in their entirety: U.S. patent application Ser. No. 14/301,788, U.S. Pat. No. 9,330,959; U.S. patent application Ser. No. 14/301,827, U.S. Pat. No. 9,312,164; and U.S. patent application Ser. No. 14/301,848, pending. With their mention in this section, these patent applications are not admitted to be prior art with respect to the present invention.

An integrated circuit may be formed by forming an isolation recess in a single crystal substrate which includes silicon, filling the isolation recess with isolation dielectric material, and planarizing the isolation dielectric material to be coplanar with the top surface of the substrate to form a buried isolation layer. A non-selective epitaxial process forms an epitaxial layer of silicon-based semiconductor material on the substrate and buried isolation layer, in which the silicon-based semiconductor material on exposed areas of the substrate is single-crystalline and the silicon-based semiconductor material on the buried isolation layer is polycrystalline or amorphous. A cap layer is formed over the epitaxial layer, and a radiantly-induced recrystallization process causes the polycrystalline or amorphous material to form single-crystalline semiconductor over the buried isolation layer. The cap layer may be removed after the recrystallization step, and the top surface of the epitaxial layer may be planarized, and possibly subsequently thinned.

Figure 1A:
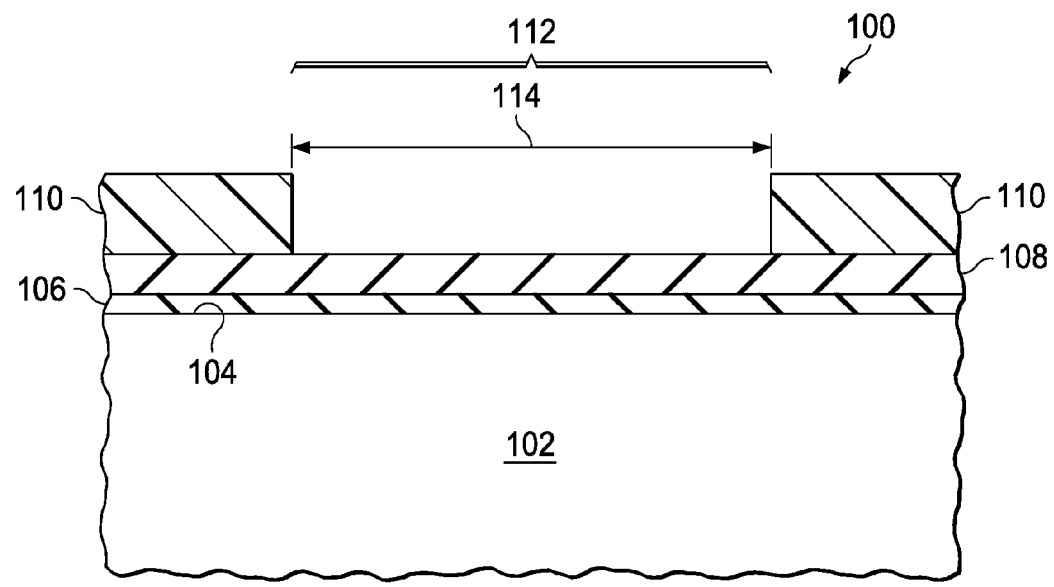
FIG. 1A through FIG. 1N are cross sections of an integrated circuit formed according to an example process sequence.
Figure 1B:
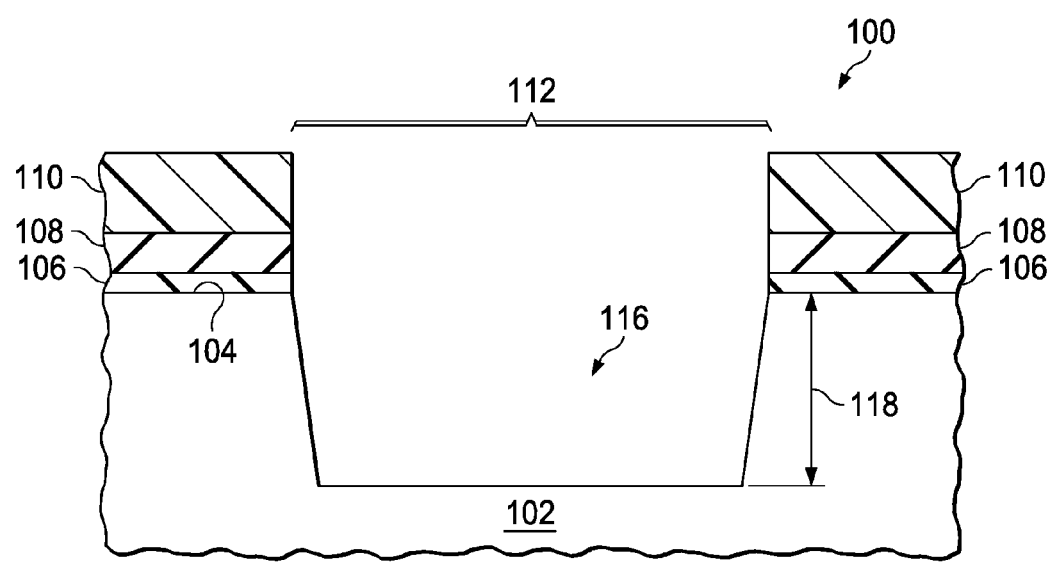
Figure 1C:
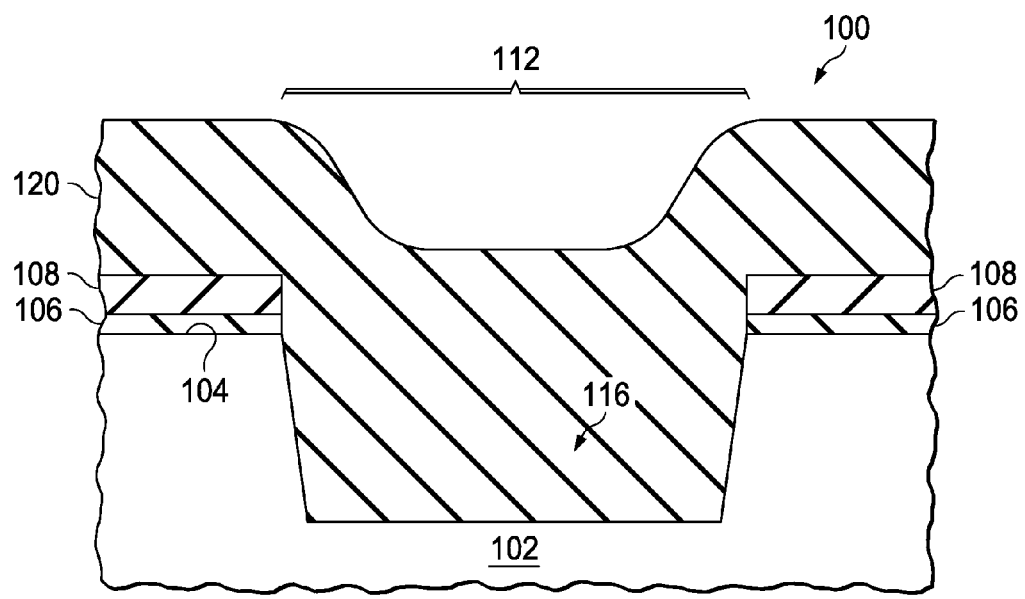
Figure 1D:
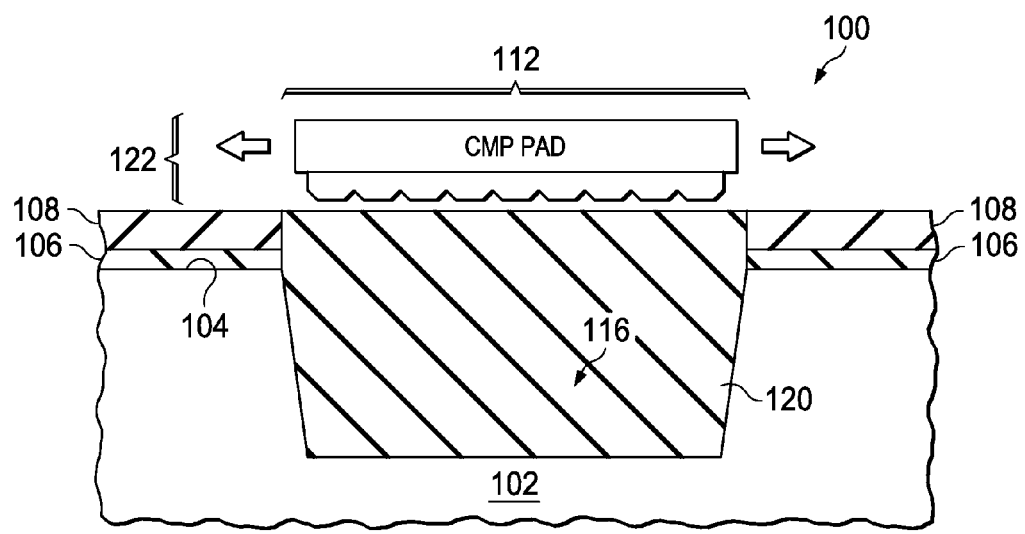
Figure 1E:
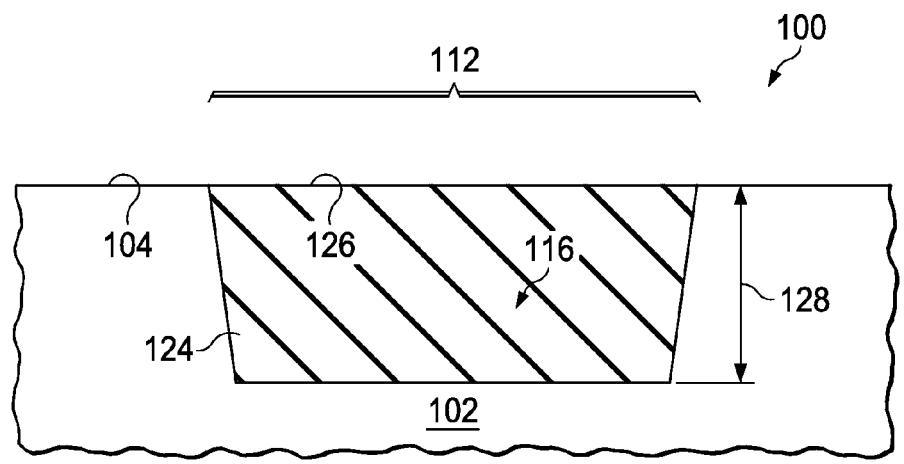
Figure 1F:
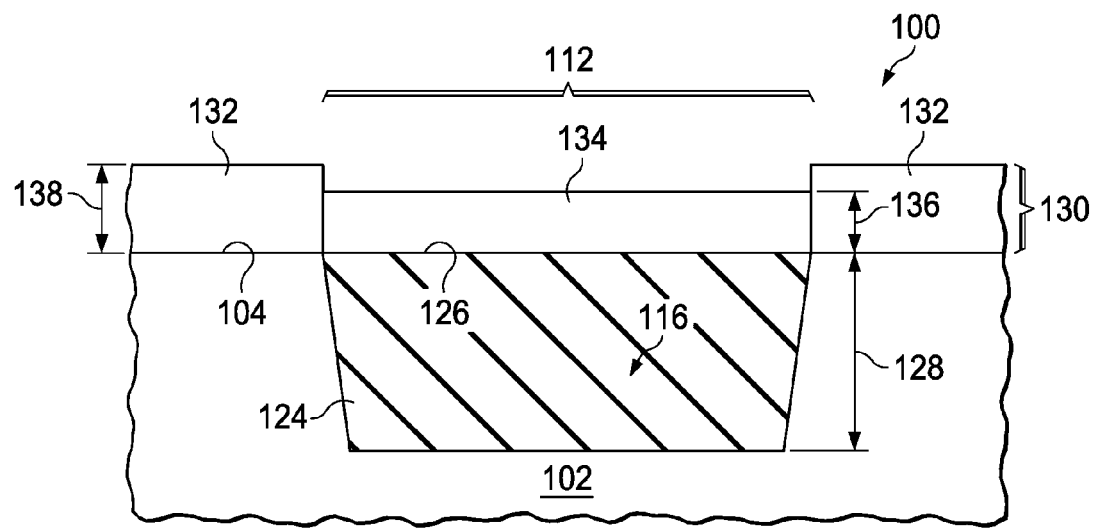
Figure 1G:
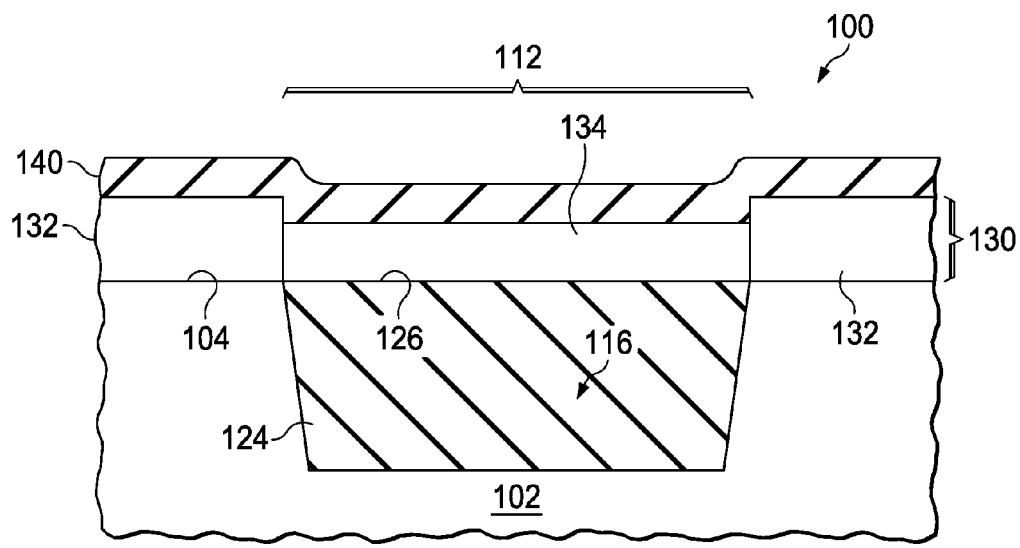
Figure 1H:
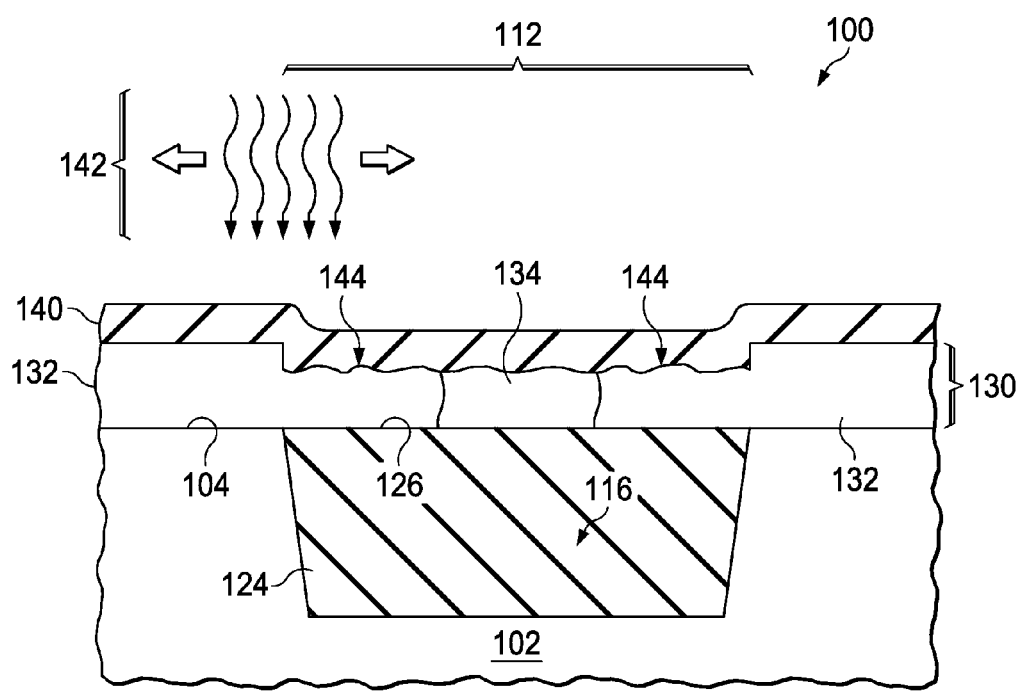
Figure 1I:
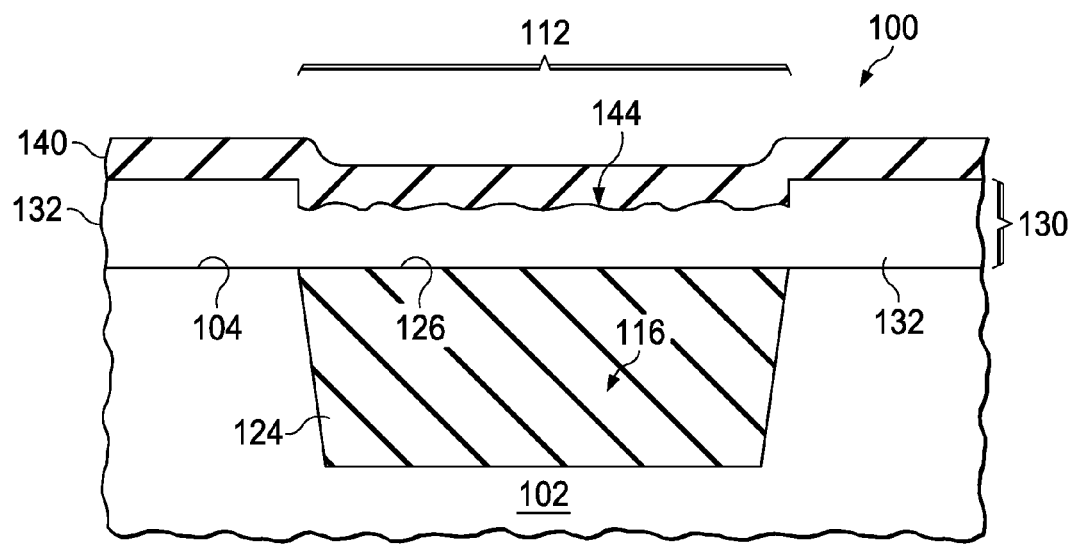
Figure 1J:
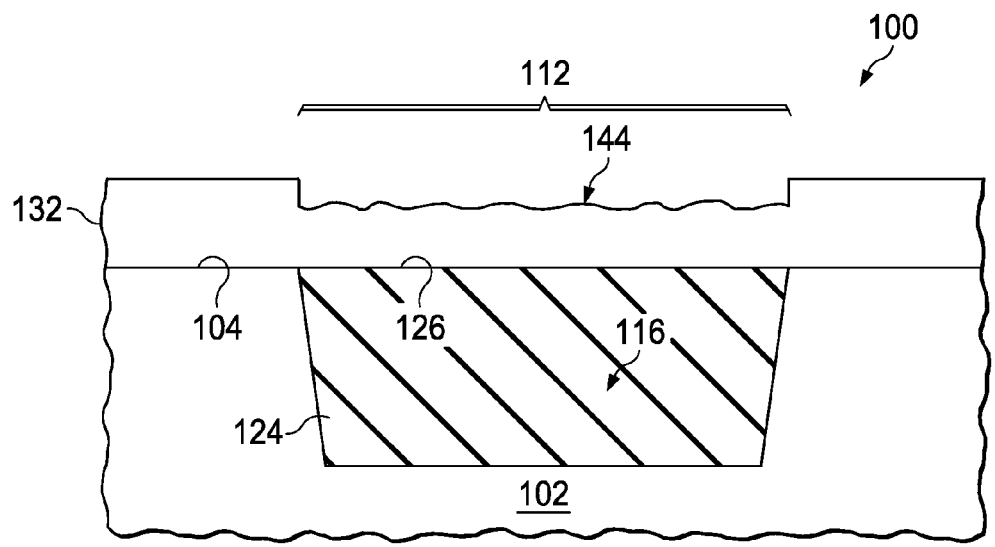
Figure 1K:
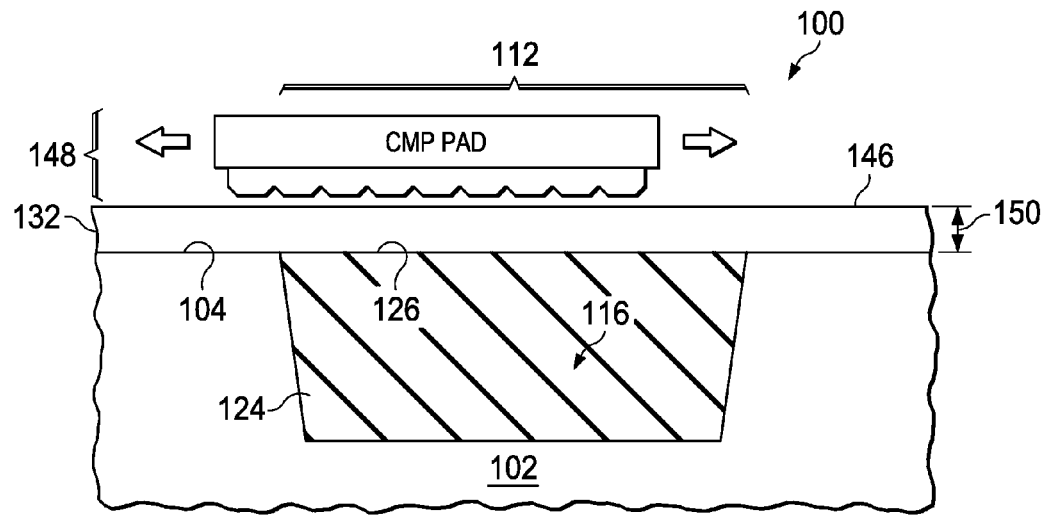
Figure 1L:
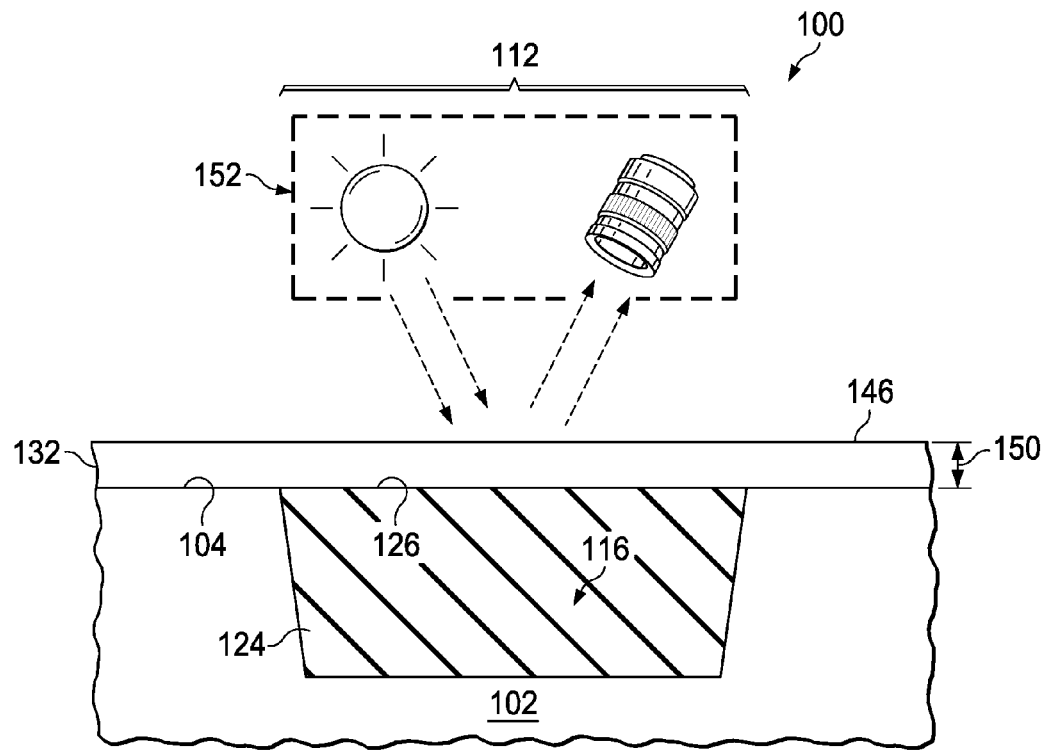
Figure 1M:
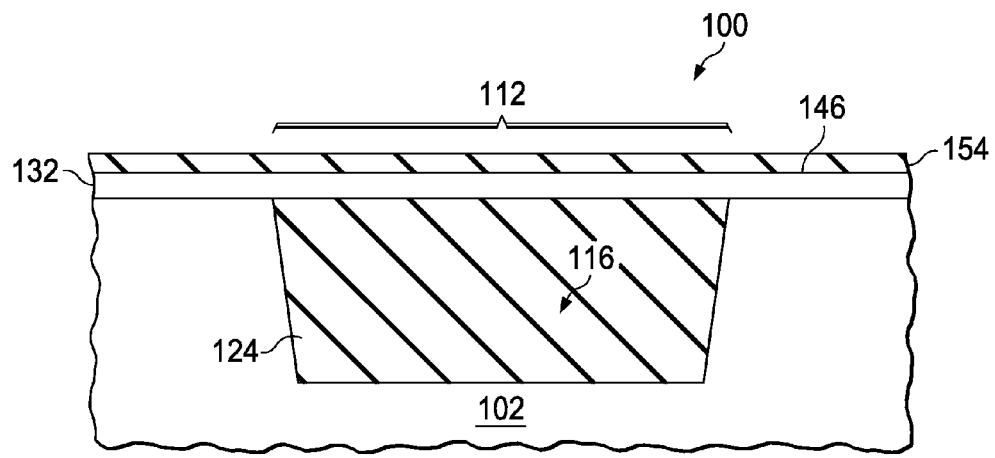
Figure 1N:
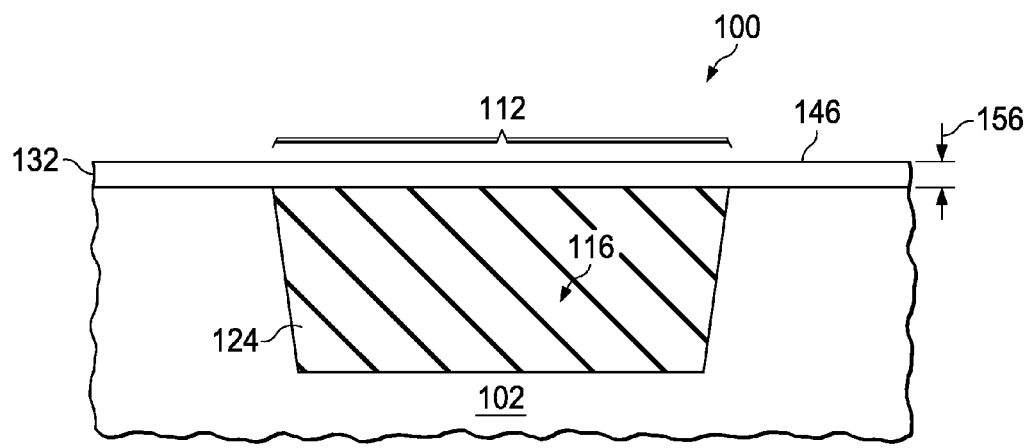

FIG. 1A through FIG. 1N are cross sections of an integrated circuit formed according to an example process sequence. Referring to FIG. 1A, the integrated circuit 100 is formed on a substrate 102 which has silicon-based single crystal semiconductor material extending to a top surface 104 of the substrate 102. The silicon-based single crystal semiconductor material may be, for example, a single crystal silicon of a bulk silicon wafer, or a silicon epitaxial layer, or a silicon-germanium semiconductor material. A sacrificial layer of silicon dioxide 106 is formed over the top surface 104. The sacrificial layer of silicon dioxide 106 may be 5 nanometers to 20 nanometers thick, and may be formed by thermal oxidation of silicon in the substrate 102 or may be deposited over the top surface 104 by a plasma enhanced chemical vapor deposition (PECVD) process or a low pressure chemical vapor deposition (LPCVD) process. A chemical mechanical polish (CMP) stop layer 108 is formed over the sacrificial layer of silicon dioxide 106. The CMP stop layer 108 may be silicon nitride, 60 nanometers to 150 nanometers thick, formed by an LPCVD process. A trench mask 110 is formed over the CMP stop layer 108 so as to expose the CMP stop layer 108 in an area for an isolated silicon layer 112 and cover the adjacent CMP stop layer 108. The trench mask 110 may include photoresist, an anti-reflection layer such as a bottom anti-reflection coating (BARC) and/or a layer of hard mask material such as amorphous carbon. The area for the isolated silicon layer 112 may have a width 114 of 200 nanometers to 300 microns.

Referring to FIG. 1B, a trench etch process removes the CMP stop layer 108, the sacrificial layer of silicon dioxide 106 and semiconductor material from the substrate 102 in the areas exposed by the trench mask 110, forming an isolation recess 116 in the substrate 102 in the area for the isolated silicon layer 112. The isolation recess 116 may have a depth 118 of, for example, 100 nanometers to 500 nanometers. The trench etch process may include a reactive ion etch (RIE) step which changes reactant gases to remove the CMP stop layer 108 and then remove the semiconductor material from the substrate 102. The trench etch process may be a timed etch process to provide a desired depth 118. After the trench etch process is completed, the trench mask 110 is removed, possibly using an ash process followed by a wet clean using an aqueous mixture of sulfuric acid and hydrogen peroxide. After the trench mask 110 is removed, an optional layer of silicon dioxide may be formed at exposed surfaces of the substrate 102 in the isolation recess 116 by thermal oxidation.

Referring to FIG. 1C, isolation dielectric material 120 is formed over an existing top surface of the integrated circuit 100, extending into and filling the isolation recess 116. The isolation dielectric material 120 may be primarily silicon dioxide, primarily aluminum oxide, or may include a plurality of sublayers of different dielectric materials. Silicon dioxide in the isolation dielectric material 120 may be formed by an atmospheric pressure chemical vapor deposition (APCVD) process using silane and oxygen, a PECVD process using tetraethyl orthosilicate, also known as tetraethoxysilane (TEOS), a high density plasma (HDP) process, and/or an ozone-based thermal chemical vapor deposition (CVD) process, also known as a high aspect ratio process (HARP). Aluminum oxide in the isolation dielectric material 120 may be formed by a physical vapor deposition (PVD) process in an oxygen ambient, or a CVD process. The isolation dielectric material 120 may be formed by several iterations of deposition followed by partial etchback, to improve a planarity of a top surface of the isolation dielectric material 120.

Referring to FIG. 1D, the isolation dielectric material 120 is planarized down to the CMP stop layer 108 by a CMP process 122, depicted in FIG. 1D by a CMP Pad 154. The CMP process may use a cerium oxide slurry which has a higher removal rate of the isolation dielectric material 120 than of the CMP stop layer 108.

Referring to FIG. 1E, the CMP stop layer 108 of FIG. 1D, and possibly a portion or all of the sacrificial layer of silicon dioxide 106 are removed. The CMP stop layer 108 may be removed by a wet etch of aqueous phosphoric acid at 150° C. to 155° C. The sacrificial layer of silicon dioxide 106 may be removed by a buffered dilute aqueous solution of hydrofluoric acid. Removal of the CMP stop layer 108 and the sacrificial layer of silicon dioxide 106 may also remove material from the isolation dielectric material 120. The isolation dielectric material 120 in the isolation recess 116 forms a buried isolation layer 124. A top surface 126 of the buried isolation layer 124 is substantially coplanar with the top surface 104 of the substrate 102. The buried isolation layer 124 may have a thickness 128 of 100 nanometers to 500 nanometers.

Referring to FIG. 1F, a non-selective epitaxial process forms an epitaxial layer 130 of silicon-based semiconductor material on the top surface 104 of the substrate 102 and the top surface 126 of the buried isolation layer 124. The epitaxial layer 130 includes a single-crystalline region 132 on the substrate 102 and a non-crystalline region 134 on the buried isolation layer 124 laterally contacting the single-crystalline region 132. The non-crystalline region 134 may be polycrystalline or amorphous. A thickness 136 of the non-crystalline region 134 may be 50 nanometers to 200 nanometers thicker than a desired final thickness of a single-crystalline layer over the buried isolation layer 124. For example, the thickness 136 of the non-crystalline region 134 may be 125 nanometers for a final desired thickness of 75 nanometers for the single-crystalline layer over the buried isolation layer 124. A thickness 138 of the single-crystalline region 132 may be substantially equal to the thickness 136 of the non-crystalline region 134, or may be greater than the thickness 136 of the non-crystalline region 134 as depicted in FIG. 1F. The non-selective epitaxial process may start with an in situ clean process such as the Applied Materials Siconi™ clean process, to remove any native oxide from the top surface 104 of the substrate 102. The non-selective epitaxial process may provide silane ($SiH_4$) and/or disilane ($Si_2H_6$) at 20 standard cubic centimeters per minute (sccm) to 200 sccm at a pressure of 10 torr to 100 torr and a temperature of 500° C. to 700° C., which may provide a growth rate of 5 nanometers per minute to 50 nanometers per minute. Alternatively, the non-selective epitaxial process may provide trisilane ($Si_3H_8$) at 20 milligrams per minute to 250 milligrams per minute at a pressure of 10 torr to 100 torr and a temperature of 400° C. to 650° C. The epitaxial layer 130 may be grown at a higher rate using trisilane than using silane and disilane at a same temperature, or the epitaxial layer 130 may be grown at a rate equivalent to the silane/disilane rate at a lower temperature. In some versions of the instant example, the gases provided to the substrate 102 by the non-selective epitaxial process during formation of the epitaxial layer 130 may be substantially free of chlorine-containing gas, which may form the single-crystalline region 132 and the non-crystalline region 134 with substantially the same thicknesses 138 and 136, respectively. In other versions, the gases provided to the substrate 102 during formation of the epitaxial layer 130 may be include some chlorine-containing gas, which may form the single-crystalline region 132 thicker, for example 20 percent thicker, than the non-crystalline region 134. For example, the non-selective epitaxial process may provide dichlorosilane ($SiH_2Cl_2$) with hydrogen ($H_2$) at a pressure of 20 torr to 100 torr and a temperature of 1080° C. to 1120° C., which may provide a growth rate of 500 nanometers per minute to 2 microns per minute. Alternatively, the non-selective epitaxial process may provide trichlorosilane (SiHCl$_3$) with hydrogen at a pressure of 500 torr to 760 torr and a temperature of 1115° C. to 1200° C., which may provide a growth rate of 3.5 microns per minute to 4 microns per minute.

Referring to FIG. 1G, a cap layer 140 is formed over the epitaxial layer 130. The cap layer 140 may include one or more layers of silicon dioxide, silicon nitride and/or silicon oxynitride. The cap layer 140 may be 50 nanometers to 200 nanometers thick, and may be formed by a PECVD process using TEOS for silicon dioxide and bis (tertiary-butylamino) silane (BTBAS) for silicon nitride. The cap layer 140 may have a thickness which provides an anti-reflection layer with respect to the non-crystalline region 134 for a subsequent radiantly-induced recrystallization process.

Referring to FIG. 1H, a radiantly-induced recrystallization process 142 heats the non-crystalline region 134 to a higher temperature than the single-crystalline region 132 of the epitaxial layer 130 so that the non-crystalline region 134 recrystallizes so as to extend the single-crystalline region 132 over the buried isolation layer 124. FIG. 1H depicts the radiantly-induced recrystallization process 142 partway to completion. The radiantly-induced recrystallization process 142 may raise the temperature of the non-crystalline region 134 above its melting point. Forming the cap layer 140 to provide an anti-reflection layer with respect to the non-crystalline region 134 may advantageously couple more radiant energy from the radiantly-induced recrystallization process 142 into the non-crystalline region 134 than into the single-crystalline region 132, thereby promoting low defects in the extended single-crystalline region 132. The radiantly-induced recrystallization process 142 may produce a roughened interface 144 between cap layer 140 and the newly recrystallized portion of the single-crystalline region 132 over the buried isolation layer 124. The radiantly-induced recrystallization process 142 may include, for example, a scanned laser anneal process 142, as depicted schematically in FIG. 1H. Alternatively, the radiantly-induced recrystallization process 142 may be a flash lamp anneal process, or other radiant process which provides energy to the non-crystalline region 134 from a radiant source in any part of the electromagnetic spectrum. Forming the epitaxial layer 130 to have the single-crystalline region 132 above the substrate 102 and laterally abutting the non-crystalline region 134 may enable the newly recrystallized portion of the single-crystalline region 132 over the buried isolation layer 124 to form with fewer defects than an epitaxial layer without a single-crystalline region laterally abutting a non-crystalline region.

FIG. 1I shows the integrated circuit 100 after the radiantly-induced recrystallization process 142 of FIG. 1H is completed. The single-crystalline region 132 of the epitaxial layer 130 extends across the buried isolation layer 124.

Referring to FIG. 1J, the cap layer 140 of FIG. 1I is removed without removing a significant portion of the single-crystalline region 132. The cap layer 140 may be removed by a plasma etch, or by a wet etch using a dilute buffered aqueous solution of hydrofluoric acid.

Referring to FIG. 1K, the single-crystalline region 132 is planarized to provide a smooth top surface 146 of the single-crystalline region 132 extending over the substrate 102 and the buried isolation layer 124. The single-crystalline region 132 may be planarized by a CMP process 148, depicted in FIG. 1K by a CMP Pad 148. Alternatively, the single-crystalline region 132 may be planarized by another method, such as a resist etchback process. The single-crystalline region 132 may possibly be planarized to a thickness 150 which may be suitable for forming components over the buried isolation layer 124. Alternatively, the planarization process 148 may be performed to obtain a desired flatness and smoothness of the top surface 146, and the single-crystalline region 132 may be subsequently thinned by another method, for example as described in reference to FIG. 1L through FIG. 1N.

Referring to FIG. 1L, the thickness 150 of the planarized single-crystalline region 132 over the buried isolation layer 124 may optionally be measured. The thickness 150 may be measured, for example, by an optical reflectometer instrument 152 as depicted schematically in FIG. 1L. Other methods of measuring the thickness 150 of the planarized single-crystalline region 132 over the buried isolation layer 124 are within the scope of the instant example. The measured thickness may be compared to a desired thickness to estimate an amount of the single-crystalline region 132 to be subsequently removed.

Referring to FIG. 1M, a thermal oxidation process may be used to consume a desired thickness of the single-crystalline region 132 at the top surface 146, forming a layer of thermal oxide 154 on the single-crystalline region 132. Consuming the desired thickness of the single-crystalline region 132 using the thermal oxidation process may advantageously consume a uniform amount of the single-crystalline region 132 across the integrated circuit 100. Other methods of consuming the desired thickness of the single-crystalline region 132, such as a CMP process or a timed blanket etch process, are within the scope of the instant example.

Referring to FIG. 1N, the layer of thermal oxide 154 of FIG. 1M on the single-crystalline region 132 is removed, leaving the single-crystalline region 132 having a final thickness 156 over the buried isolation layer 124. The layer of thermal oxide 154 may be removed by a plasma etch process, selective to the single-crystalline region 132 and endpointed at the top surface 146 of the single-crystalline region 132. Alternatively, the layer of thermal oxide 154 may be removed by a timed wet etch process using a buffered diluted aqueous solution of hydrofluoric acid. The single-crystalline region 132 over the buried isolation layer 124 provides the isolated silicon layer 112. The final thickness 156 may be no greater than 100 nanometers, for example 75 nanometers to 100 nanometers. Components such as transistors may subsequently be formed in the leaving the single-crystalline region 132 over the buried isolation layer 124, advantageously having a low capacitance to the substrate 102.

Figure 2A:
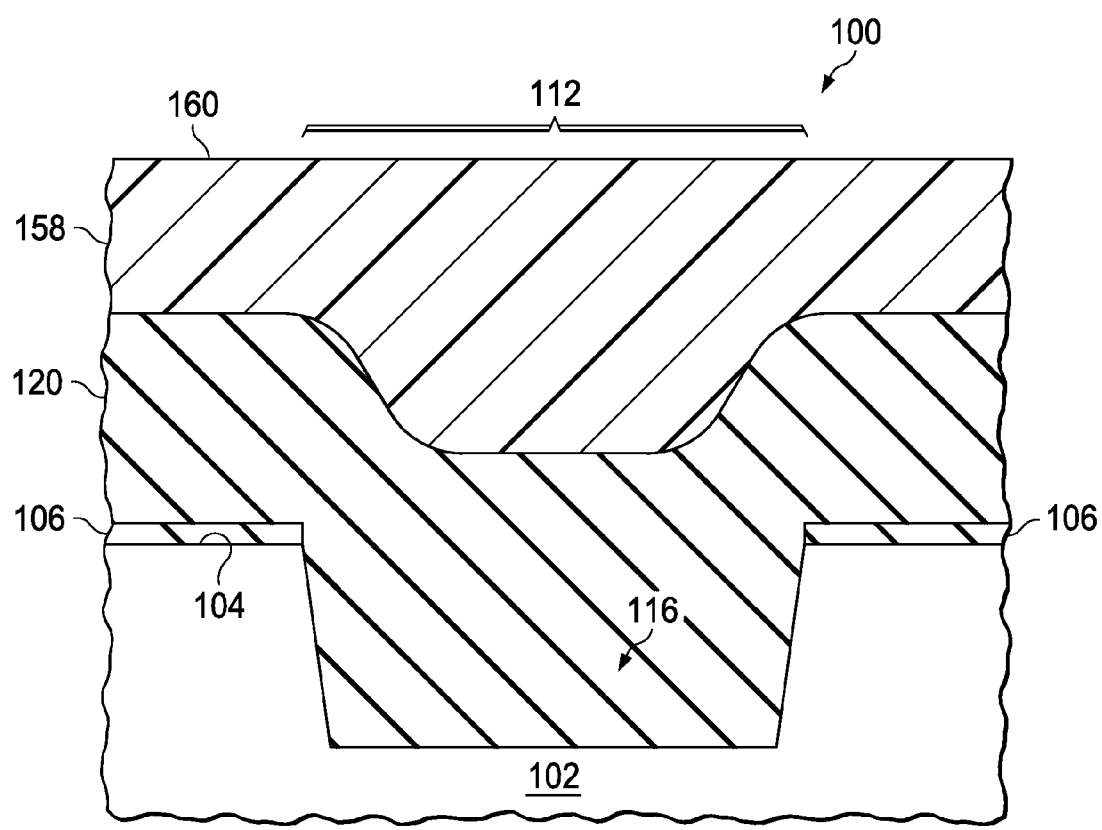
FIG. 2A through FIG. 2C are cross sections of the integrated circuit of FIG. 1A through FIG. 1N, depicting an alternate method of planarizing the isolation dielectric material.
Figure 2B:
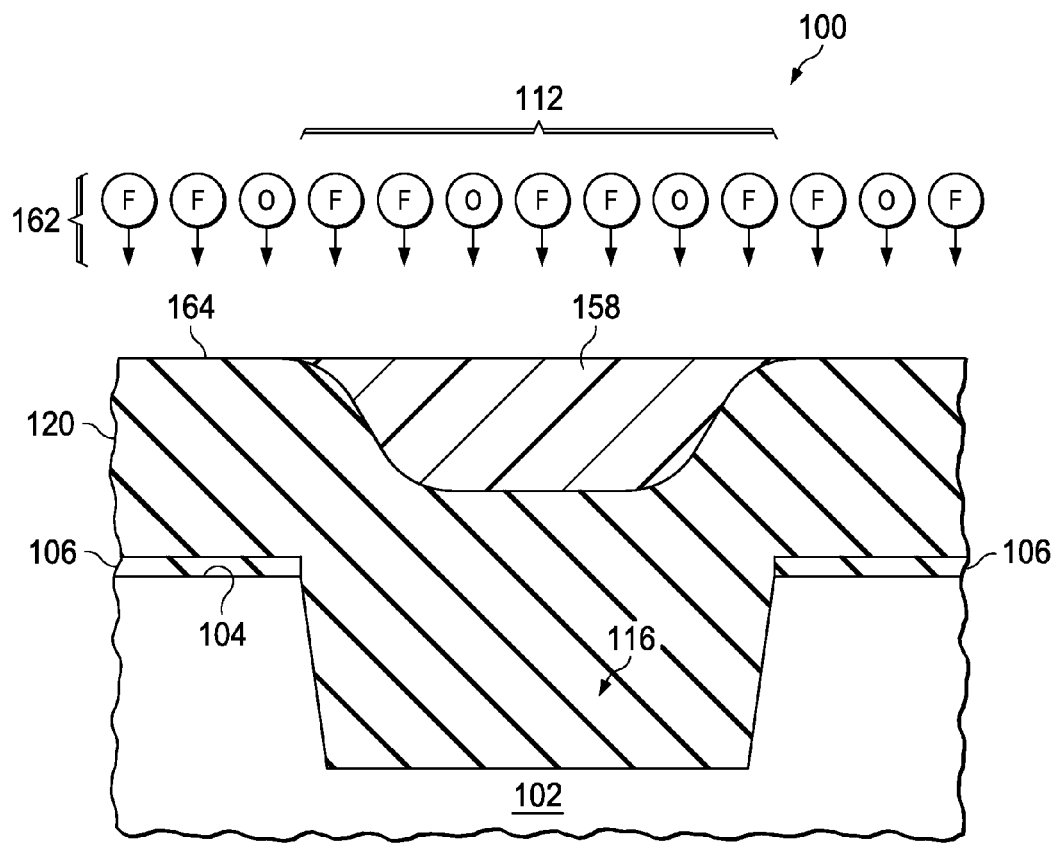
Figure 2C:
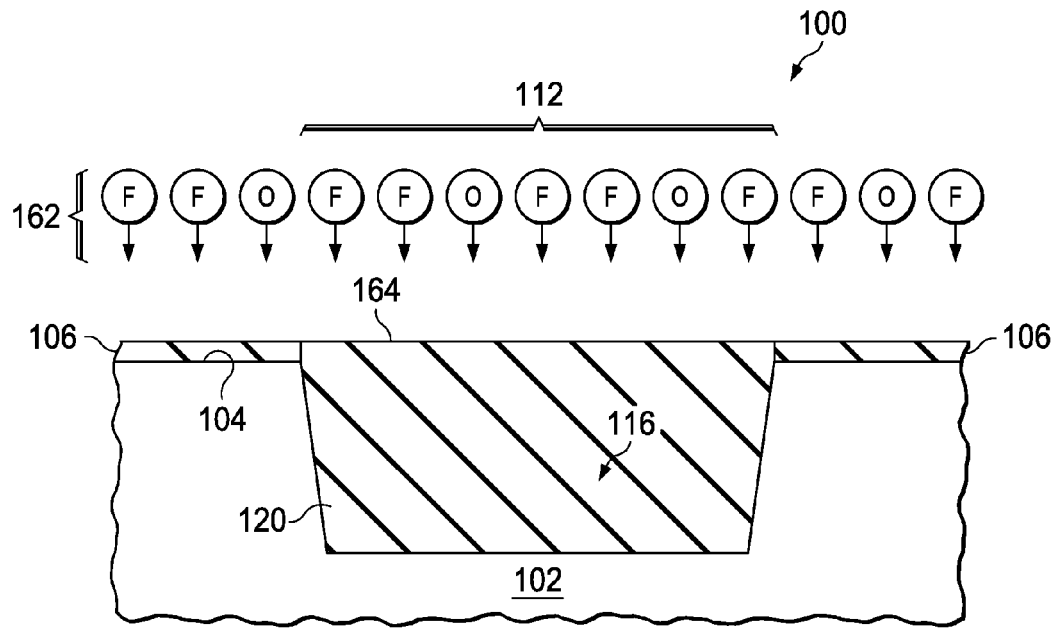

FIG. 2A through FIG. 2C are cross sections of the integrated circuit of FIG. 1A through FIG. 1N, depicting an alternate method of planarizing the isolation dielectric material. Referring to FIG. 2A, the sacrificial layer of silicon dioxide 106 is formed over the top surface 104 of the substrate 102. The isolation dielectric material 120 is formed over an existing top surface of the integrated circuit 100, extending into and filling the isolation recess 116. A planarizing layer of organic polymer 158 is formed over the isolation dielectric material 120 so as to have a substantially planar top surface 160 over the isolation recess 116. The planarizing layer of organic polymer 158 may include a polyisoprene resin, commonly associated with negative tone g-line photoresist, or a novolak resin, commonly associated with positive tone i-line photoresist. Other organic polymer materials appropriate for forming the planarizing layer of organic polymer 158 are within the scope of the instant example. The planarizing layer of organic polymer 158 may be formed by spin coating a mixture of the organic polymer and a solvent, and subsequently removing at least a portion of the solvent by baking the integrated circuit 100.

Referring to FIG. 2B, an etchback process 162 removes material from the planarizing layer of organic polymer 158 and the isolation dielectric material 120 at substantially the same rate, so that a top surface 164 of the isolation dielectric material 120 becomes more planar. The etchback process 162 may be, for example, a plasma etch process using fluorine and oxygen radicals. FIG. 2B depicts the etchback process 162 partway to completion.

FIG. 2C depicts the etchback process 162 near completion. The etchback process 162 may remove a portion or all of the sacrificial layer of silicon dioxide 106. If the etchback process 162 leaves any of the sacrificial layer of silicon dioxide 106, a subsequent wet etch may be used to remove the remaining sacrificial layer of silicon dioxide 106 as described in reference to FIG. 1E. In some versions of the instant example, formation of the planarizing layer of organic polymer 158 and the etchback process 162 may be repeated to obtain a desired planarity of the top surface 164 of the isolation dielectric material 120. Formation of the integrated circuit 100 proceeds as described in reference to FIG. 1F et seq.

Figure 3A:
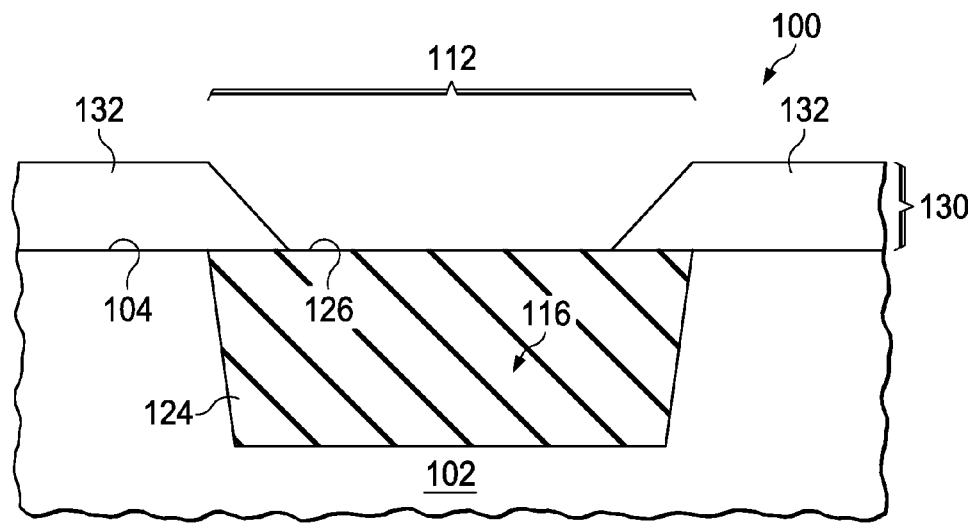
FIG. 3A through FIG. 3E are cross sections of the integrated circuit of FIG. 1A through FIG. 1N, depicting an alternate method for forming the single-crystalline region and the non-crystalline region, and for the subsequent radiantly-induced recrystallization process.

FIG. 3A through FIG. 3E are cross sections of the integrated circuit of FIG. 1A through FIG. 1N, depicting an alternate method for forming the single-crystalline region and the non-crystalline region, and for the subsequent radiantly-induced recrystallization process. Referring to FIG. 3A, the buried isolation layer 124 is formed in the substrate 102 of the integrated circuit 100. The epitaxial layer 130 is formed over the top surface 104 of the substrate 102 and the top surface 126 of the buried isolation layer 124 so as to form the single-crystalline region 132 over the substrate 102 adjacent to the buried isolation layer 124 and extending partway, but not completely, onto the top surface 126 of the buried isolation layer 124. Formation of the epitaxial layer 130 may start with an in situ clean process such as the Applied Materials Siconi™ clean process, to remove any native oxide from the top surface 104 of the substrate 102. The epitaxial layer 130 may be formed, for example, using trichlorosilane (SiCl$_3$H) to provide a portion of the silicon for the epitaxial growth process. In the instant example, the single-crystalline region 132 has a sloped profile over the buried isolation layer 124. Other profiles, for example a substantially vertical profile, are within the scope of the instant example.

Figure 3B:
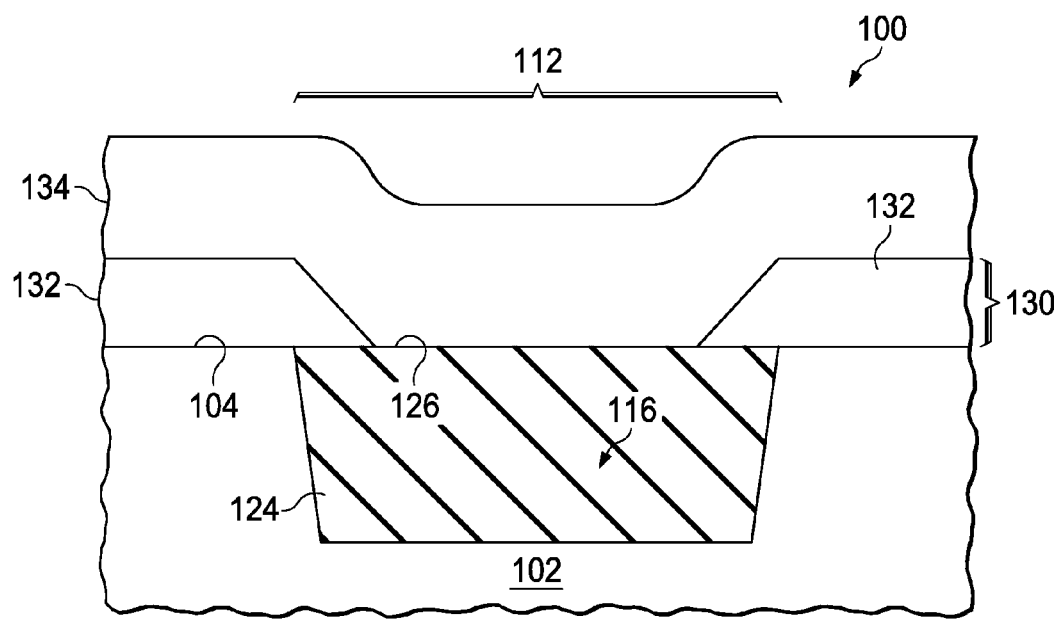

Referring to FIG. 3B, the non-crystalline region 134 is formed over the single-crystalline region 132 and the buried isolation layer 124 as a layer of polycrystalline silicon 134, referred to as polysilicon. The polysilicon non-crystalline region 134 may be formed, for example, by thermal decomposition of silane at a temperature of 550° C. to 600° C. and a pressure of 0.2 torr to 1 torr. Forming the non-crystalline region 134 separately from the single-crystalline region 132 may advantageously provide more thickness control for each region 132 and 134 compared to concurrent formation.

Figure 3C:
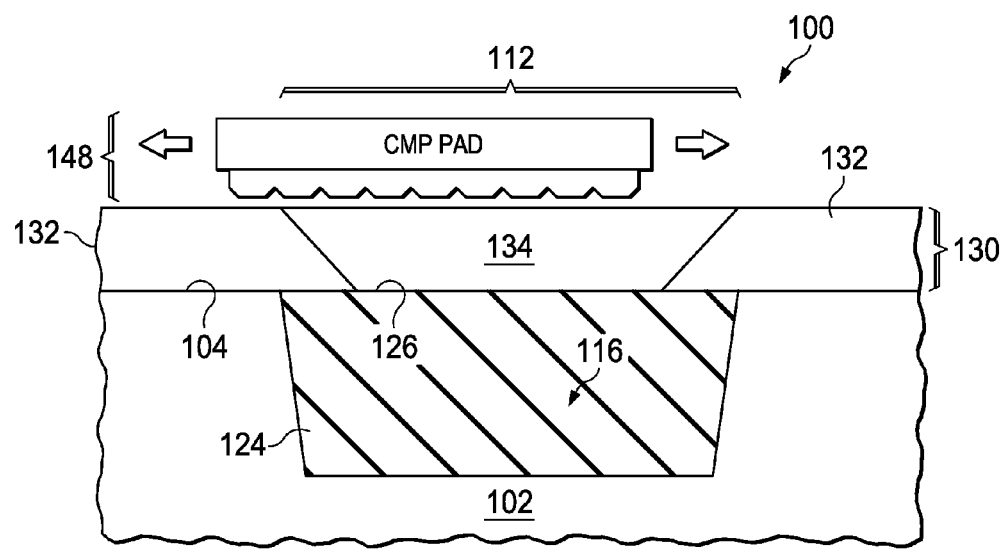

Referring to FIG. 3C, the single-crystalline region 132 and the polysilicon non-crystalline region 134 are planarized, for example by a CMP process 148 as described in reference to FIG. 1K. Other methods, such as resist etchback, for planarizing the single-crystalline region 132 and the polysilicon non-crystalline region 134 are within the scope of the instant example. Planarizing the single-crystalline region 132 and the polysilicon non-crystalline region 134 may advantageously provide better control of the final thickness of the isolated silicon layer 112.

Figure 3D:
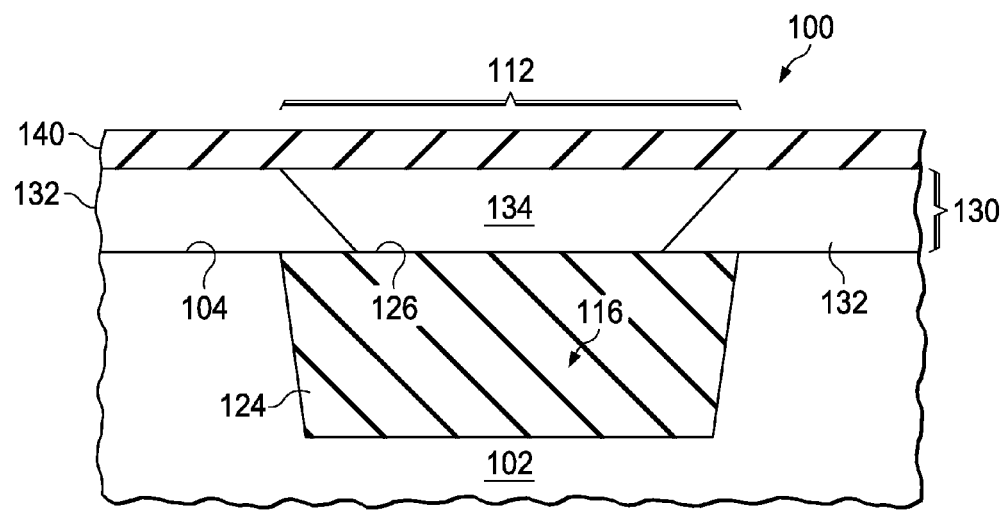

Referring to FIG. 3D, the cap layer 140 is formed over the single-crystalline region 132 and the polysilicon non-crystalline region 134, as described in reference to FIG. 1G. The cap layer 140 may have a thickness which provides an anti-reflection layer with respect to the non-crystalline region 134.

Figure 3E:
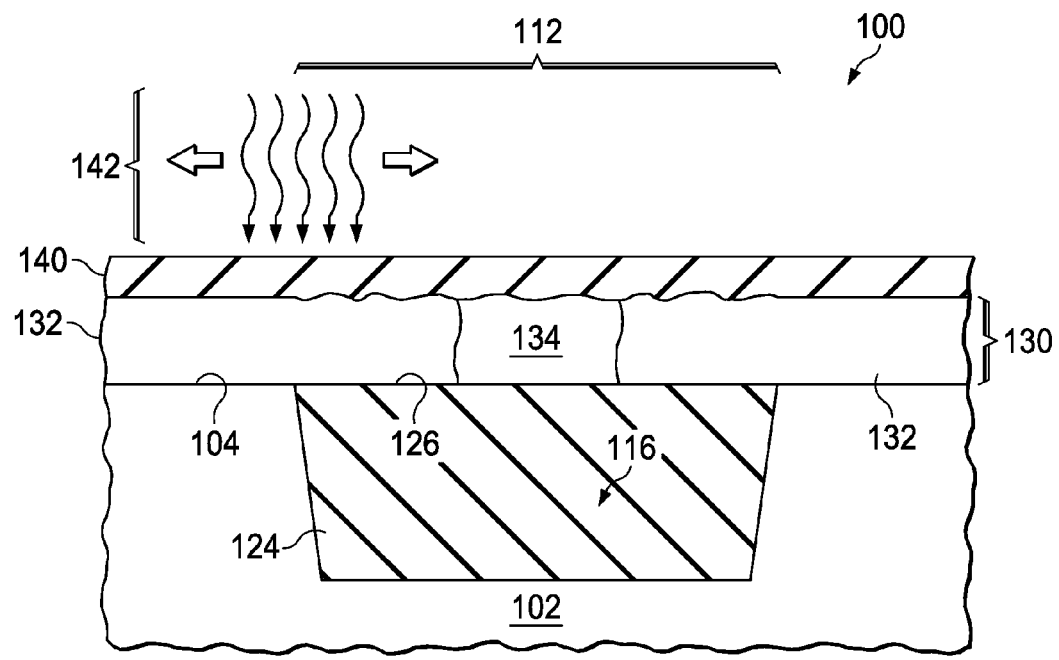

Referring to FIG. 3E, the radiantly-induced recrystallization process 142 heats the non-crystalline region 134 to a higher temperature than the single-crystalline region 132 so that the non-crystalline region 134 recrystallizes so as to extend the single-crystalline region 132 over the buried isolation layer 124, as described in reference to FIG. 1H. FIG. 3E depicts the radiantly-induced recrystallization process 142 partway to completion. After the radiantly-induced recrystallization process 142 is completed, the single-crystalline region 132 extends across the buried isolation layer 124. Formation of the integrated circuit 100 is continued as described in reference to FIG. 1K et seq.

Figure 4A:
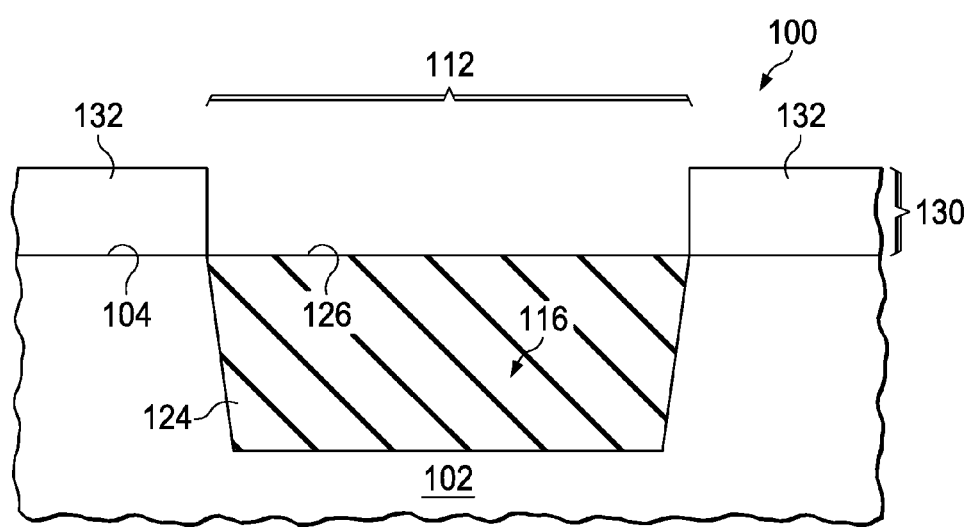
FIG. 4A through FIG. 4D are cross sections of the integrated circuit of FIG. 1A through FIG. 1N, depicting another method for forming the single-crystalline region and the non-crystalline region, and for the subsequent radiantly-induced recrystallization process.

FIG. 4A through FIG. 4D are cross sections of the integrated circuit of FIG. 1A through FIG. 1N, depicting another method for forming the single-crystalline region and the non-crystalline region, and for the subsequent radiantly-induced recrystallization process. Referring to FIG. 4A, the buried isolation layer 124 is formed in the substrate 102 of the integrated circuit 100. The epitaxial layer 130 is formed over the top surface 104 of the substrate 102 and the top surface 126 of the buried isolation layer 124 so as to form the single-crystalline region 132 over the substrate 102 adjacent to the buried isolation layer 124 without extending onto the top surface 126 of the buried isolation layer 124. The epitaxial layer 130 may be formed, for example, using chlorine-containing reagents such as hydrogen chloride (HCl) to provide prevent silicon from forming on the buried isolation layer 124. In the instant example, the single-crystalline region 132 has a substantially vertical profile over a boundary between the substrate 102 and the buried isolation layer 124. Other profiles, such as a sloped profile, are within the scope of the instant example.

Figure 4B:
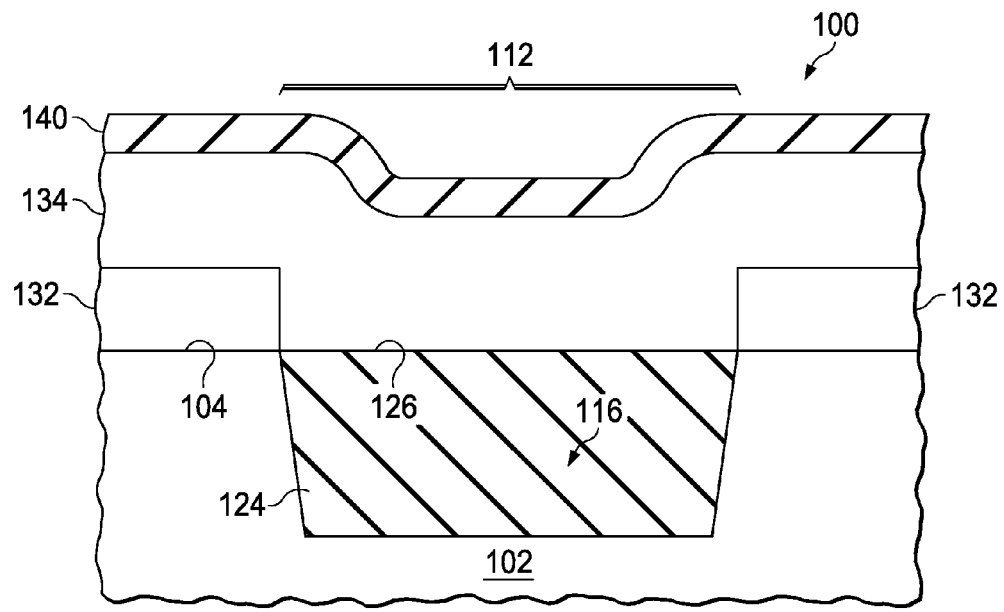

Referring to FIG. 4B, the non-crystalline region 134 is formed over the single-crystalline region 132 and the buried isolation layer 124 as a layer of polysilicon 134. The polysilicon non-crystalline region 134 may be formed, for example, as described in reference to FIG. 3B. In the instant example, a thickness of the polysilicon non-crystalline region 134 is greater than a thickness of the non-crystalline region 134. Other thicknesses of the polysilicon non-crystalline region 134 are within the scope of the instant example. The cap layer 140 is formed over the polysilicon non-crystalline region 134, without planarizing the polysilicon non-crystalline region 134, thereby advantageously reducing fabrication cost and complexity of the integrated circuit 100. The cap layer 140 may have a thickness which provides an anti-reflection layer with respect to the non-crystalline region 134.

Figure 4C:
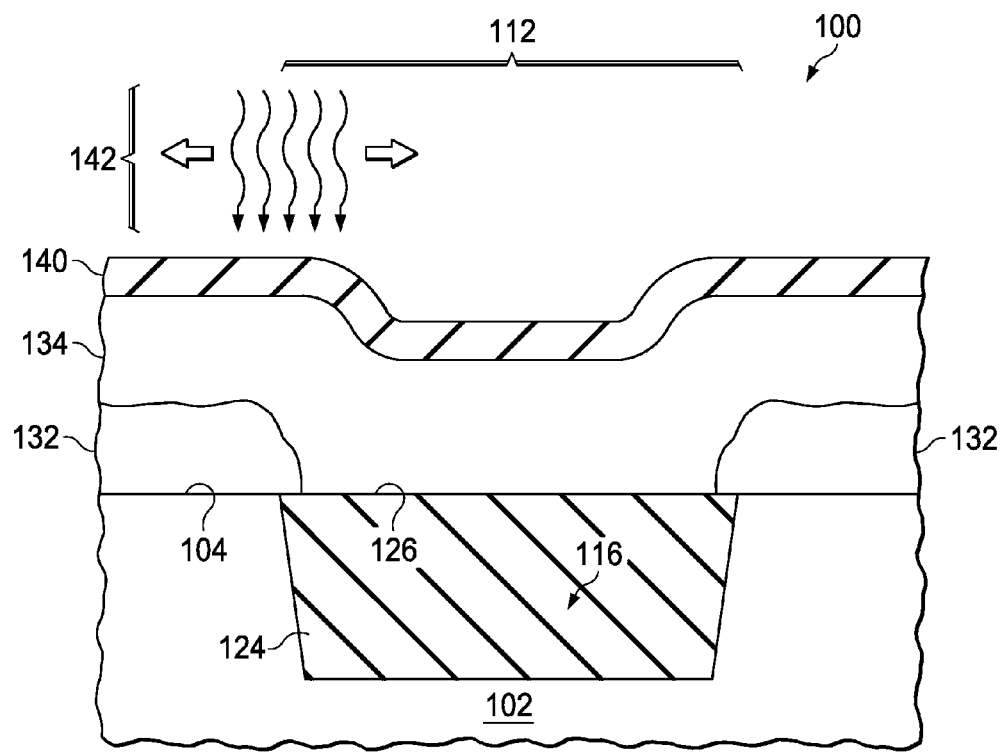

Referring to FIG. 4C, the radiantly-induced recrystallization process 142 heats the non-crystalline region 134 to a higher temperature than the single-crystalline region 132 so that the polysilicon non-crystalline region 134 recrystallizes so as to extend the single-crystalline region 132 over the buried isolation layer 124, as described in reference to FIG. 1H. FIG. 4C depicts the radiantly-induced recrystallization process 142 partway to completion. Forming the cap layer 140 over the unplanarized polysilicon non-crystalline region 134 may advantageously couple more radiant energy from the radiantly-induced recrystallization process 142 into the polysilicon non-crystalline region 134.

Figure 4D:
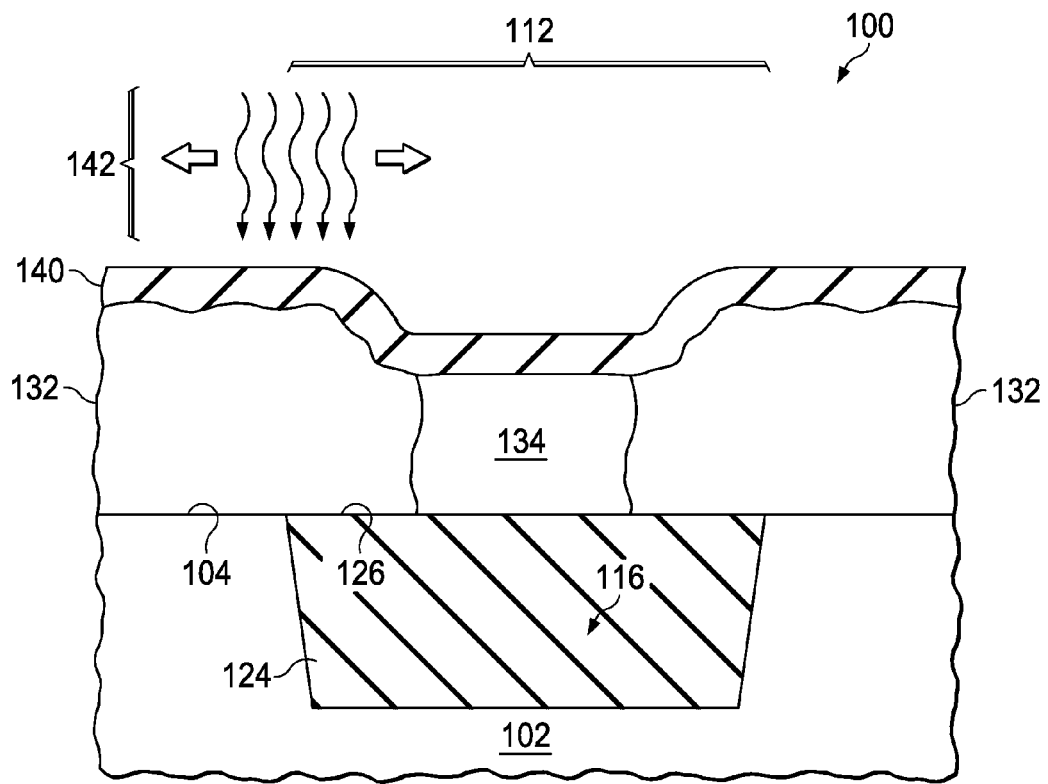

Referring to FIG. 4D, the radiantly-induced recrystallization process 142 is continued so that the single-crystalline region 132 extends up to the cap layer 140 and over the buried isolation layer 124. FIG. 4D depicts the radiantly-induced recrystallization process 142 partway to completion. After the radiantly-induced recrystallization process 142 is completed, the single-crystalline region 132 extends across the buried isolation layer 124. Formation of the integrated circuit 100 is continued as described in reference to FIG. 1K et seq.

Figure 5A:
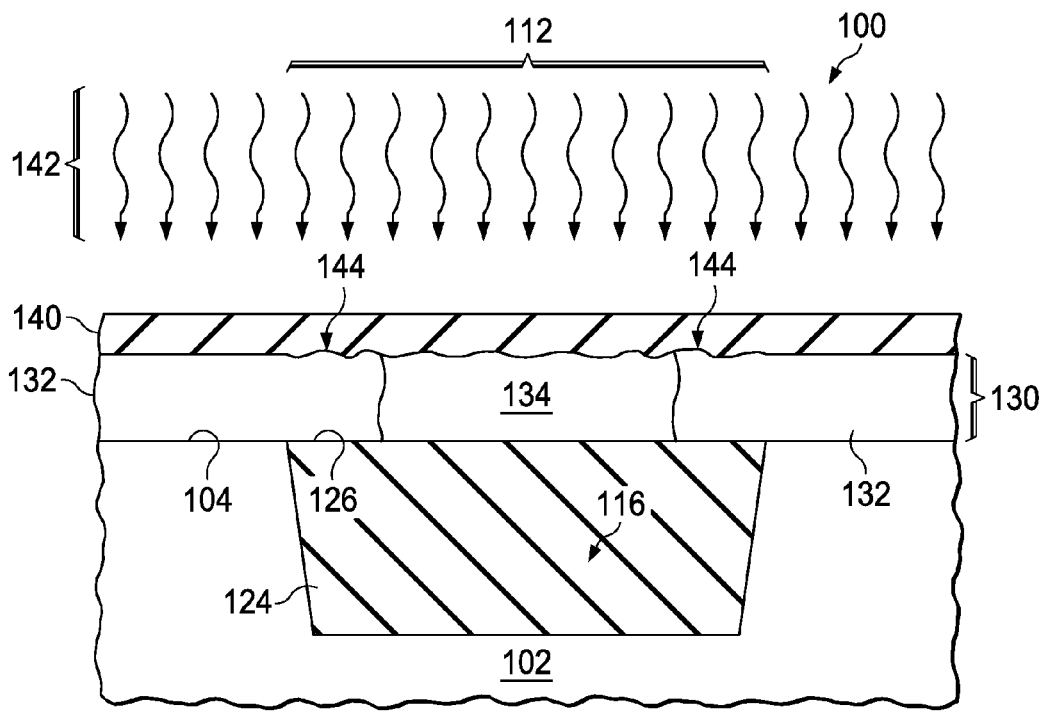
FIG. 5A and FIG. 5B are cross sections of the integrated circuit of FIG. 1A through FIG. 1N, depicting an alternate method for the radiantly-induced recrystallization process.
Figure 5B:
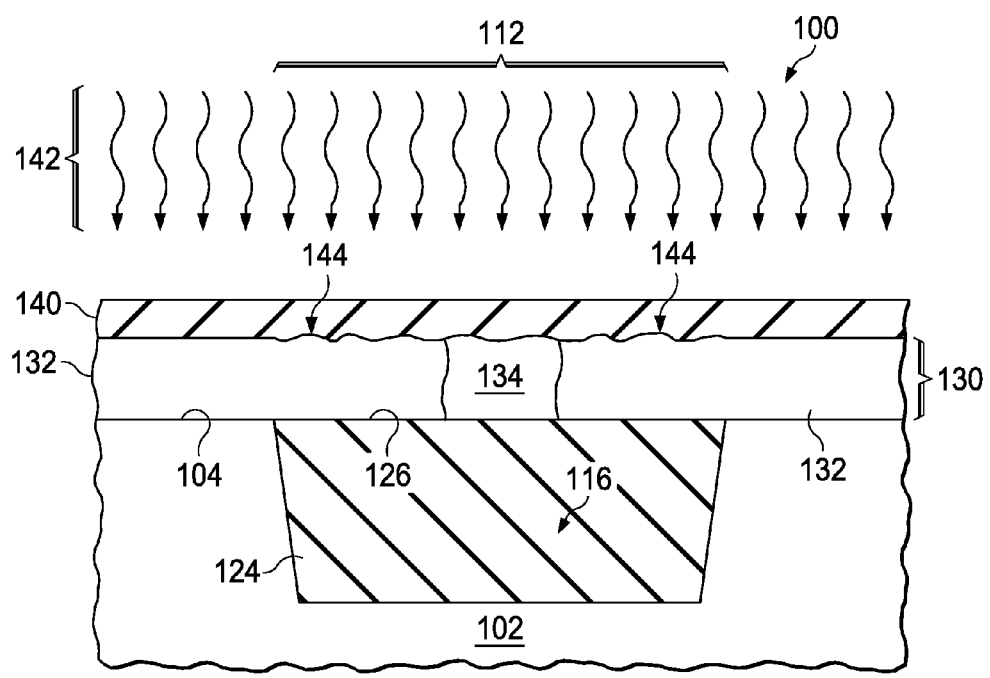

FIG. 5A and FIG. 5B are cross sections of the integrated circuit of FIG. 1A through FIG. 1N, depicting an alternate method for the radiantly-induced recrystallization process. Referring to FIG. 5A, the epitaxial layer 130 is formed over the substrate 102 of the integrated circuit 100 and the buried isolation layer 124. In the instant example, the epitaxial layer 130 is formed so that the single-crystalline region 132 and the non-crystalline region 134 have substantially equal thicknesses. The cap layer 140 is formed over the epitaxial layer 130. In the instant example, the radiantly-induced recrystallization process 142 is a flash lamp anneal process 142 which irradiates substantially all of the epitaxial layer 130 concurrently. The flash lamp anneal process 142 includes one or more flash irradiation steps which provide the radiant energy for less than a millisecond. FIG. 5A depicts the flash lamp anneal process 142 partway to completion. The non-crystalline region 134 may be melted by the flash lamp anneal process 142 while the single-crystalline region is not melted.

FIG. 5B depicts the integrated circuit 100 as the flash lamp anneal process 142 is nearer to completion, for example after a second flash irradiation step. The non-crystalline region 134 continues to recrystallize, adding to the single-crystalline region 132. After the flash lamp anneal process 142 is completed, the non-crystalline region 134 will have completely recrystallized, so that the single-crystalline region 132 of the epitaxial layer 130 extends across the buried isolation layer 124. Formation of the integrated circuit 100 proceeds as described in reference to FIG. 1J et seq.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:
   providing a substrate comprising silicon-based single crystal semiconductor material extending to a top surface of the substrate;
   forming an isolation recess in the substrate;
   forming a buried isolation layer in the isolation recess, the buried isolation layer comprising dielectric material, so that a top surface of the buried isolation layer is substantially coplanar with the top surface of the substrate adjacent to the buried isolation layer;
   using a non-selective epitaxial process to form an epitaxial layer of silicon-based semiconductor material on the top surface of the substrate and on the top surface of the buried isolation layer so that the epitaxial layer includes a single-crystalline region on the substrate and a non-crystalline region on the buried isolation layer laterally contacting the single-crystalline region;
   heating the epitaxial layer by a radiantly-induced recrystallization process that heats the non-crystalline region to a higher temperature than the single-crystalline region so that the non-crystalline region recrystallizes so as to extend the single-crystalline region over the buried isolation layer; and
   planarizing a top surface of the single-crystalline region over the buried isolation layer.

2. The method of claim 1, further comprising removing a top portion of the single-crystalline region over the buried isolation layer, after the step of planarizing the top surface of the single-crystalline region.

3. The method of claim 2, wherein the top portion of the single-crystalline region over the buried isolation layer is removed by consuming the top portion of the single-crystalline region by a thermal oxidation process to form a layer of thermal oxide on the single-crystalline region, followed by removing the layer of thermal oxide.

4. The method of claim 1, wherein a final thickness of the single-crystalline region over the buried isolation layer is 75 nanometers to 100 nanometers.

5. The method of claim 1, wherein the buried isolation layer comprises primarily silicon dioxide.

6. The method of claim 1, wherein the radiant-induced recrystallization process includes a scanned laser anneal process.

7. The method of claim 1, wherein the buried isolation layer is formed by: forming a chemical mechanical polish (CMP) stop layer over the substrate prior to the step of forming the isolation recess, forming isolation dielectric material over the CMP stop layer, extending into and filling the isolation recess; planarizing the isolation dielectric material down to the CMP stop layer by a CMP process; and removing the CMP stop layer.

8. The method of claim 1, wherein the step of forming the epitaxial layer is performed so that gases provided to the substrate during formation of the epitaxial layer are substantially free of chlorine-containing gas.

9. The method of claim 1, wherein the step of forming the epitaxial layer is performed so that gases provided to the substrate during formation of the epitaxial layer include some chlorine-containing gas.

10. The method of claim 1, comprising: forming a cap layer over the epitaxial layer, prior to the step of heating the epitaxial layer by the radiantly-induced recrystallization process; and removing the cap layer, after the step of heating the epitaxial layer by the radiantly-induced recrystallization process.

11. A method of forming an integrated circuit, comprising the steps:
   providing a substrate comprising silicon-based single crystal semiconductor material extending to a top surface of the substrate;
   forming an isolation recess in the substrate;
   forming a buried isolation layer in the isolation recess, the buried isolation layer comprising dielectric material, so that a top surface of the buried isolation layer is substantially coplanar with the top surface of the substrate adjacent to the buried isolation layer;
   forming an epitaxial layer of silicon-based semiconductor material including a single-crystalline region on the top surface of the substrate so that at least a portion of a top surface of the buried dielectric layer is substantially free of the epitaxial layer and another portion of said top surface is covered by the epitaxial layer;

forming a layer of non-crystalline silicon-based semiconductor material over the epitaxial layer and the buried isolation layer to provide a non-crystalline region of the silicon-based semiconductor material over the buried isolation layer laterally contacting the single-crystalline region;

forming a cap layer over the layer of non-crystalline silicon-based semiconductor material;

heating the epitaxial layer by a radiantly-induced recrystallization process that heats the non-crystalline region to a higher temperature than the single-crystalline region so that the non-crystalline region recrystallizes so as to extend the single-crystalline region over the buried isolation layer;

removing the cap layer; and planarizing a top surface of the single-crystalline region over the buried isolation layer.

12. The method of claim 11, further comprising removing a top portion of the single-crystalline region over the buried isolation layer, after the step of planarizing the top surface of the single-crystalline region.

13. The method of claim 12, wherein the top portion of the single-crystalline region over the buried isolation layer is removed by consuming the top portion of the single-crystalline region by a thermal oxidation process to form a layer of thermal oxide on the single-crystalline region, followed by removing the layer of thermal oxide.

14. The method of claim 11, wherein a final thickness of the single-crystalline region over the buried isolation layer is 75 nanometers to 100 nanometers.

15. The method of claim 11, wherein the buried isolation layer comprises primarily silicon dioxide.

16. The method of claim 11, wherein the radiant-induced recrystallization process includes a scanned laser anneal process.

17. The method of claim 11, further comprising planarizing the non-crystalline region before the step of heating the epitaxial layer by the radiantly-induced recrystallization process.

18. The method of claim 11, wherein the step of forming the epitaxial layer is performed so that gases provided to the substrate during formation of the epitaxial layer include some chlorine-containing gas.

19. The method of claim 11, comprising: forming a cap layer over the epitaxial layer, prior to the step of heating the epitaxial layer by the radiantly-induced recrystallization process; and removing the cap layer, after the step of heating the epitaxial layer by the radiantly-induced recrystallization process.

20. A method of forming an integrated circuit, comprising the steps:

providing a substrate comprising silicon-based single crystal semiconductor material extending to a top surface of the substrate;

forming a sacrificial layer of silicon dioxide over the substrate;

forming a CMP stop layer comprising silicon nitride over the sacrificial layer of silicon dioxide;

forming a trench mask over the CMP stop layer so as to expose the CMP stop layer in an area for an isolation recess;

removing material from the CMP stop layer, the sacrificial layer of silicon dioxide and the substrate to form an isolation recess in the substrate;

removing the trench mask;

forming isolation dielectric material comprising primarily silicon dioxide over the CMP stop layer, extending into and filling the isolation recess;

planarizing the isolation dielectric material down to the CMP stop layer by a CMP process;

removing the CMP stop layer;

removing the sacrificial layer of silicon dioxide so that the isolation dielectric material in the isolation recess forms a buried isolation layer, and so that a top surface of the buried isolation layer is substantially coplanar with the top surface of the substrate adjacent to the buried isolation layer;

using a non-selective epitaxial process to form an epitaxial layer of silicon-based semiconductor material on the top surface of the substrate and on the top surface of the buried isolation layer so that the epitaxial layer includes a single crystal region on the substrate and a non-crystalline region on the buried isolation layer laterally contacting the single-crystalline region;

forming a cap layer comprising silicon dioxide over the epitaxial layer;

heating the epitaxial layer by a radiantly-induced recrystallization process that heats the non-crystalline region to a higher temperature than the single-crystalline region so that the non-crystalline region recrystallizes so as to extend the single-crystalline region over the buried isolation layer;

removing the cap layer;

subsequently planarizing a top surface of the single-crystalline region over the buried isolation layer; subsequently consuming a top portion of the single-crystalline region by a thermal oxidation process to form a layer of thermal oxide on the single-crystalline region; and removing the layer of thermal oxide.

* * * * *